United States Patent
Wang et al.

(10) Patent No.: US 11,704,991 B2
(45) Date of Patent: Jul. 18, 2023

(54) POWER FAILURE DETECTION DEVICE AND METHOD

(71) Applicant: REALTEK SEMICONDUCTOR CORPORATION, Hsinchu (TW)

(72) Inventors: Chia-Lung Wang, Hsinchu (TW); Min-Hung Huang, Hsinchu (TW); Chien-Yi Li, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 101 days.

(21) Appl. No.: 17/316,750

(22) Filed: May 11, 2021

(65) Prior Publication Data
US 2022/0068111 A1    Mar. 3, 2022

(30) Foreign Application Priority Data
Sep. 2, 2020  (TW) .................................. 109129986

(51) Int. Cl.
*G01R 19/155*    (2006.01)
*G08B 21/18*    (2006.01)
(Continued)

(52) U.S. Cl.
CPC ....... *G08B 21/185* (2013.01); *G01R 19/1659* (2013.01); *G08B 21/182* (2013.01); *H02J 9/061* (2013.01)

(58) Field of Classification Search
USPC .... 340/654–660, 653, 661, 687, 691.6, 692, 340/693.1–693.3, 693.4, 3.62, 5.91, 7.32,
(Continued)

(56) References Cited

U.S. PATENT DOCUMENTS 3,786,219 A * 1/1974 Kornrumpf ............. H02M 5/27
                                                   219/668
2005/0162114 A1* 7/2005 Makaran ............... H02P 7/2805
                                                   318/434
(Continued)

FOREIGN PATENT DOCUMENTS

TW           202006382 A       2/2020

OTHER PUBLICATIONS

OA letter of the counterpart TW application (appl. no. 109129986) dated Apr. 29, 2021. Summary of the OA letter Claims 1-6, 9 and 10 are rejected as being unpatentable over the cited reference 1 (TW 202006382 A, also published as US20200003807A1) in view of the common knowledge of this technical field.

*Primary Examiner* — Daniel Previl
(74) *Attorney, Agent, or Firm* — WPAT, P.C.

(57) ABSTRACT

Disclosed is a power failure detection device and method capable of issuing a power failure alert early. The device includes a voltage reduction circuit, a detection voltage generating circuit, a detection circuit, and a transmitting circuit. The voltage reduction circuit is or includes at least one active electronic component, and generates an output voltage according to an input voltage higher than the output voltage. The detection voltage generating circuit is coupled between the voltage reduction circuit and a low voltage terminal, and generates a detection voltage according to the output voltage that is between the output voltage and the voltage of the low voltage terminal. The detection circuit generates a detection result according to the detection voltage and a trigger voltage. The transmitting circuit sends a power failure alert to a far-end device on condition that the detection result indicates that the detection voltage is lower than the trigger voltage.

20 Claims, 7 Drawing Sheets

(51) Int. Cl.
*G01R 19/165* (2006.01)
*H02J 9/06* (2006.01)

(58) Field of Classification Search
USPC .................................. 340/7.37, 7.58, 10.34
See application file for complete search history.

(56) References Cited

U.S. PATENT DOCUMENTS

| | | | |
|---|---|---|---|
| 2009/0316320 A1* | 12/2009 | Maeda | B60R 16/03 |
| | | | 361/92 |
| 2013/0335027 A1* | 12/2013 | Xin | G07F 17/20 |
| | | | 320/114 |
| 2018/0203074 A1* | 7/2018 | Devaal | G01R 31/3835 |
| 2020/0003807 A1* | 1/2020 | Huang | G06F 1/14 |
| 2020/0271722 A1* | 8/2020 | van Oevelen | G01R 31/31932 |
| 2020/0389103 A1* | 12/2020 | Trencseni | H02P 6/24 |

* cited by examiner

POWER FAILURE DETECTION DEVICE AND METHOD

BACKGROUND OF THE INVENTION

1. Field of the Invention

The present disclosure relates to a detection device and method, especially to a power failure detection device and method.

2. Description of Related Art

A dying gasp function allows a user terminal to have enough time to transmit a specific packet to a server terminal after power failure, and thus the server terminal can learn that the cause of the disconnection is power failure rather than problems of communication lines.

The current dying gasp function is established in the following manner a user terminal generating a division voltage of an input voltage with a resistor-type voltage divider (e.g., a 3.22 KΩ resistor and a 499Ω resistor connected in series); and the user terminal transmitting a specific packet to a server terminal when the division voltage is lower than a trigger voltage, and stopping transmitting the specific packet when the division voltage is higher than a de-trigger voltage. In normal circumstances, the above-mentioned input voltage is a 12 volts (12V) DC voltage; however, an integrated circuit (IC) for the detection of the division voltage in the user terminal cannot withstand an excessively high voltage, and thus the division voltage is usually lower than 3.3V. In light of the above, since the input voltage (≈12V) is much higher than the division voltage (<3.3V), the variation of the input voltage will be much faster than the variation of the division voltage; in other words, the slope of the voltage drop of the division voltage is relatively gradual and the division voltage cannot drop to the trigger voltage fast enough, and this leaves the user terminal very limited time to transmit the specific packet to the server terminal Besides, in order to prevent noise from triggering a false alarm in a normal power supply circumstance, the difference between the trigger voltage (e.g., 1.25V) and the division voltage (e.g., $$12 \times \frac{499\Omega}{3.22K\Omega + 499\Omega} = 1.6V$$

) should be large enough; and the lower the trigger voltage is, the less time the user terminal has for the transmission of the specific packet after power failure. In light of the above, the hold time (i.e., the duration from the time point of the division voltage being lower than the trigger voltage to the time point of the user terminal being incapable of normal operation) is very short, and if the hold time is too short, the user terminal will fail to transmit the specific packet. In order to solve the above-mentioned problems, an additional capacitor or an existing capacitor having large capacitance is required and set in a printed circuit board (PCB) where the IC for the detection of the division voltage is set, and this capacitor can slow down the descending speed of the input voltage and consequently increase the hold time. However, the above-mentioned solution requires a larger PCB for the setting of the capacitor, and this not only increases the volume the whole device, which is disadvantageous to the miniaturization of the device, but also increases the production cost.

SUMMARY OF THE INVENTION

An object of the present disclosure is to provide a power failure detection device and method that prevents the problems of the prior art.

An embodiment of the power failure detection device of the present disclosure includes a voltage reduction circuit, a detection voltage generating circuit, a detection circuit, and a transmitting circuit. The voltage reduction circuit is configured to generate an output voltage according to an input voltage, wherein the output voltage is lower than the input voltage and the voltage reduction circuit is or includes at least one active electronic component. The detection voltage generating circuit is coupled between the voltage reduction circuit and a low voltage terminal, and configured to generate a detection voltage according to the output voltage, wherein the detection voltage is lower than the output voltage and higher than a voltage of the low voltage terminal. The detection circuit is configured to generate a detection result according to the detection voltage and a trigger voltage. The transmitting circuit is configured to send a power failure alert to a far-end device on condition that the detection result indicates that the detection voltage is lower than the trigger voltage. Since the output voltage is lower than the input voltage, the detection voltage varying with the output voltage can keep up with the variation of the input voltage, and consequently the power failure alert can be issued in time.

An embodiment of the power failure detection method of the present disclosure includes the following steps: using a voltage reduction circuit to generate an output voltage according to an input voltage, wherein the output voltage is lower than the input voltage and the voltage reduction circuit is or includes at least one active electronic component; generating a detection voltage according to the output voltage; generating a detection result according to the detection voltage and a trigger voltage; and issuing a power failure alert on condition that the detection result indicates that the detection voltage is lower than the trigger voltage.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure discusses a power failure detection device and method. The device and method are applicable to a user terminal and can increase the hold time of a dying gasp function.

Figure 1:
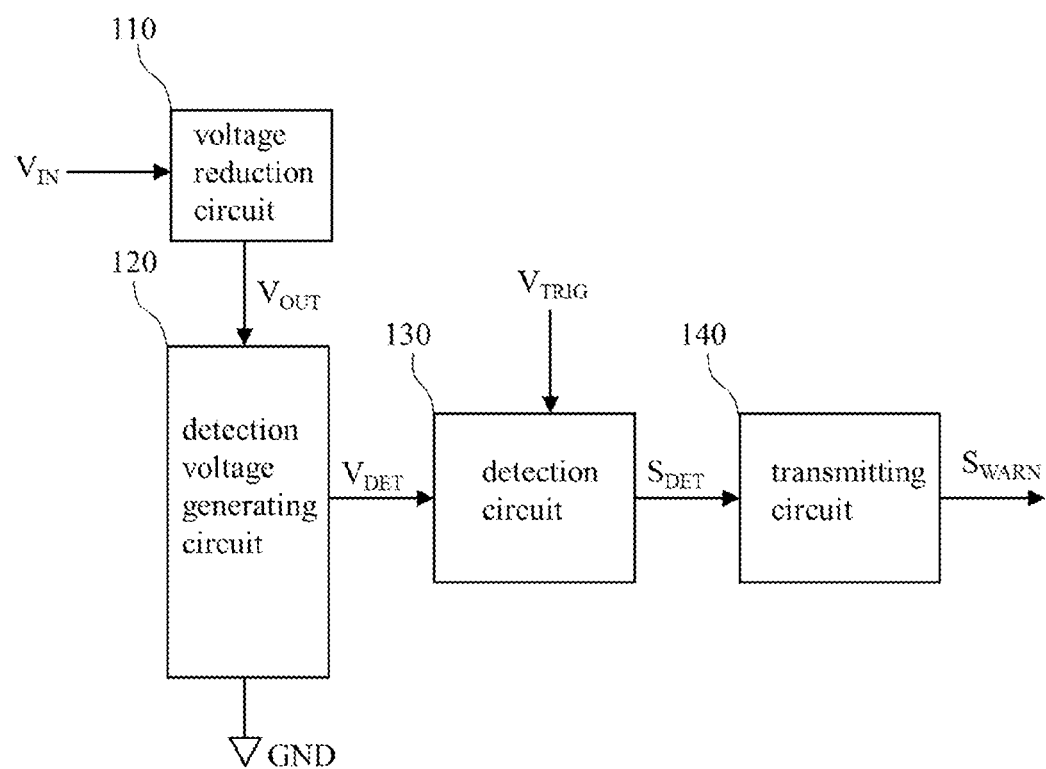
FIG. 1 shows an embodiment of the power failure detection device of the present disclosure.

FIG. 1 shows an embodiment of the power failure detection device of the present disclosure. The power failure detection device 100 of FIG. 1 includes a voltage reduction circuit 110, a detection voltage generating circuit 120, a detection circuit 130, and a transmitting circuit 140. The voltage reduction circuit 110 is or includes at least one active electronic component (e.g., at least one diode), and is configured to generate an output voltage (Your) according to an input voltage ($V_{IN}$), wherein the output voltage is lower than the input voltage; for example, the output voltage is lower than a half of the input voltage. The detection voltage generating circuit 120 is coupled between the voltage reduction circuit 110 and a low voltage terminal (GND) (e.g., a ground terminal), and configured to generate a detection voltage ($V_{DET}$) according to the output voltage, wherein the detection voltage is lower than the output voltage and higher than the voltage of the low voltage terminal; in other words, the detection voltage is between the output voltage and the voltage of the low voltage terminal. The detection circuit 130 is configured to generate a detection result ($S_{DET}$) according to the detection voltage and a trigger voltage ($V_{TRIG}$). The transmitting circuit 140 is configured to send a power failure alert ($S_{WARN}$) (e.g., a known/self-developed dying gasp packet) to a far-end device (e.g., an optical line terminal (OLT)) on condition that the detection result indicates that the detection voltage is lower than the trigger voltage, wherein the far-end device and the power failure detection device 100 are distinct and separate. In light of the above, since the output voltage is lower than the input voltage, the detection voltage varying with the output voltage can keep up with the variation of the input voltage, and consequently the power failure alert can be issued in time.

Figure 2:
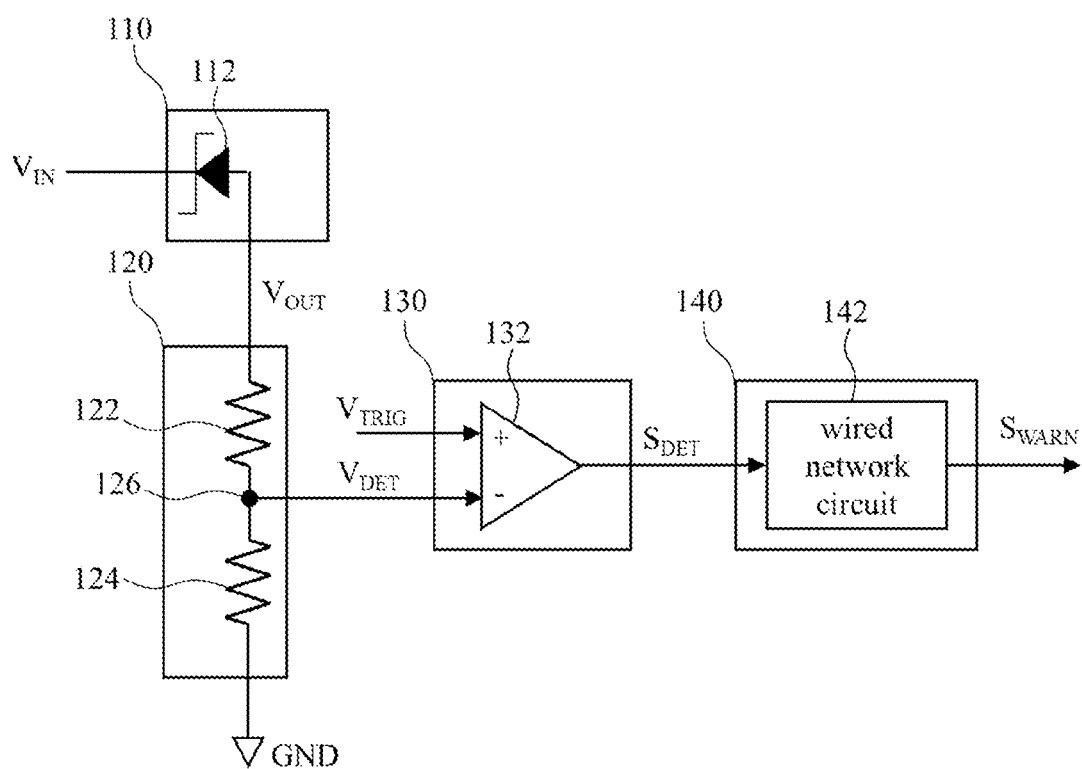
FIG. 2 shows an exemplary implementation of the power failure detection device of FIG. 1.

FIG. 2 shows an exemplary implementation of the power failure detection device 100 of FIG. 1. In this exemplary implementation, the rated value of the input voltage is 12 volts (12V), the error percentage of the rated value is limited to 5%, the trigger voltage is 1.25V, and a de-trigger voltage that is used as a basis for stopping sending the power failure alert is 1.55V. The voltage reduction circuit 110 includes a Zener diode 112; the breakdown voltage of the Zener diode is 9.1V, the error percentage of the breakdown voltage is limited to 2%, and the voltage error per degree of the Zener diode 112 is limited to 0.007V/° C.; and on the above premise, the output voltage is equal to the input voltage minus the breakdown voltage (i.e., $V_{OUT}$=12V−9.1V). The detection voltage generating circuit 120 includes a first resistor 122, a second resistor 124, and a node 126 coupled between the first resistor 122 and the second resistor 124. The nominal resistance of the first resistor 122 is 49.9 ohm (49.9Ω) and the error thereof is not under consideration here; the nominal resistance of the second resistor 124 is 430Ω and the error thereof is not under consideration here; and the voltage at the node 126 is the detection voltage. The detection circuit 130 includes a comparator 132 for comparing the detection voltage ($V_{DET}$) with the trigger voltage ($V_{TRIG}$) and thereby generating the detection result ($S_{DET}$). When the detection voltage is higher than the trigger voltage, the detection result shows a first detection result (e.g., low level), and this doesn't fulfill the requirements for the transmission of the power failure alert; and when the detection voltage is lower than the trigger voltage, the detection result shows a second detection result (e.g., high level), and this fulfills the requirements for the transmission of the power failure alert. The transmitting circuit 140 includes a wired-network circuit 142 applicable to wired-network communication. The wired-network circuit 142 is configured to generate a wired-network packet as the power failure alert, and to transmit the wired-network packet to the far-end device.

Please refer to FIG. 2. In a normal power supply circumstance, if the above-mentioned error percentages and errors are not taken into consideration, the detection voltage can be calculated according to the following equation:

$$V_{DET} = \frac{(12 - 9.1) \times 430}{430 + 49.9} = 2.598V$$

In regard to the above equation, the detection voltage (i.e., 2.598V) is higher than the trigger voltage (i.e., 1.25V) and higher than the de-trigger voltage (i.e., 1.55V). Since the detection voltage is adequately higher than the trigger voltage, the detection voltage causes no false alarm; and since the detection voltage is adequately higher than the de-trigger voltage, the transmission of the power failure alert can be halted as soon as the power supply recovers. In the normal power supply circumstance, if the above-mentioned error percentages and errors are taken into consideration and the temperature rises up to 50° C., the minimum detection voltage (i.e., the detection voltage in the worst case) can be calculated according to the following equation:

$$V_{DET} = \frac{(12 \times 0.95 - 9.1 \times 1.02 - 0.007 \times 50) \times 430}{430 + 49.9} = 1.584V$$

In regard to the above equation, the minimum detection voltage (i.e., 1.584V) is still higher than the trigger voltage (i.e., 1.25V) and higher than the de-trigger voltage (i.e., 1.55V); accordingly, the detection voltage causes no false alarm, and the transmission of the power failure alert can be halted as soon as the power supply recovers. In a power failure circumstance without considering the above-mentioned error percentages, errors, and temperature variation, the input voltage decreases after power failure; when the input voltage decreases to 10.5V, the detection voltage is 1.254V which is approaching the trigger voltage (i.e., 1.25V); accordingly, as the input voltage continually decreases, the detection result will soon change from the first detection result (i.e., $V_{DET}$>$V_{TRIG}$) to the second detection result (i.e., $V_{DET}$<$V_{TRIG}$), and then the requirements for the transmission of the power failure alert is fulfilled.

Figure 3:
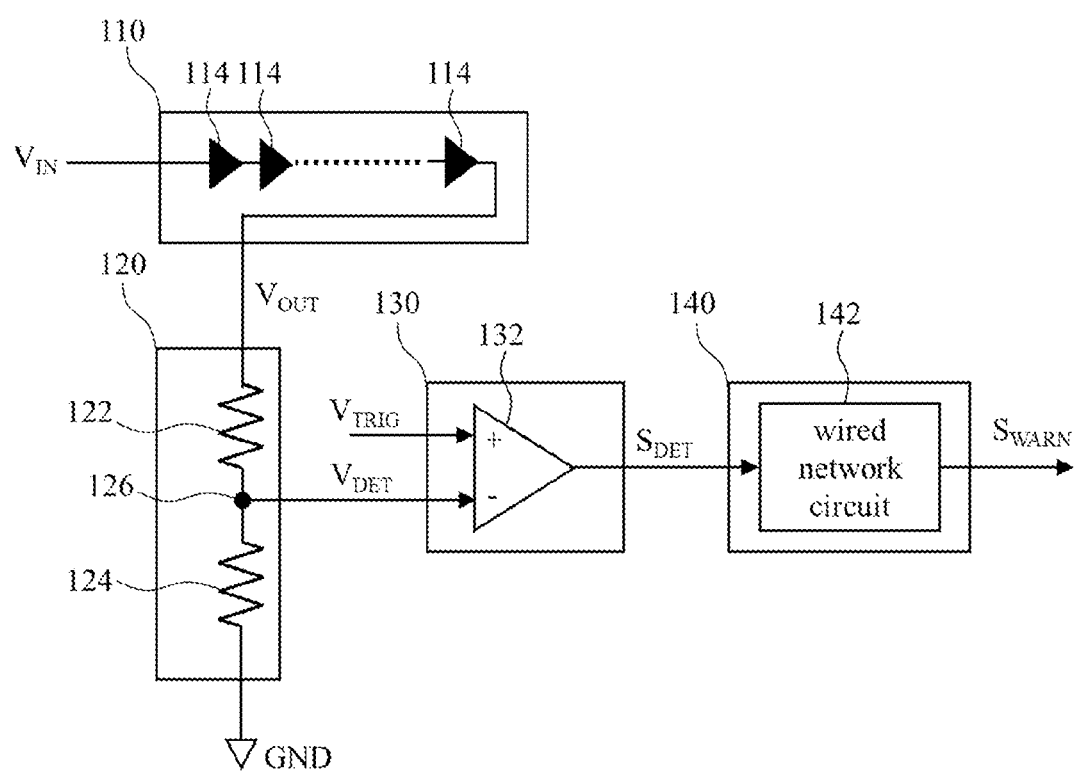
FIG. 3 shows another exemplary implementation of the power failure detection device of FIG. 1.

FIG. 3 shows another exemplary implementation of the power failure detection device 100 of FIG. 1. The exemplary implementation of FIG. 3 is the same as the exemplary implementation of FIG. 2 except the voltage reduction circuit 110. In FIG. 3, the voltage reduction circuit 110 includes thirteen diodes 114 connected in series; the threshold voltage of each diode 114 for conduction is 0.7V and the total threshold voltage amounts to 9.1V; the error percentage of the threshold voltage of each diode 114 is limited to 1%; the voltage error per degree of each diode 114 is limited to $$\frac{0.007}{13} V/°C;$$

and the output voltage can be estimated based on the above and is equal to the input voltage minus the total threshold voltage. In a normal power supply circumstance, if the above-mentioned error percentage, errors, and temperature variation are not taken into consideration, the detection voltage of FIG. 3 can be calculated according to the following equation:

$$V_{DET} = \frac{(12 - 13 \times 0.7) \times 430}{430 + 49.9} = 2.598V$$

In regard to the above equation, the detection voltage (i.e., 2.598V) is higher than the trigger voltage (i.e., 1.25V) and higher than the de-trigger voltage (i.e., 1.55V). Since the detection voltage is adequately higher than the trigger voltage, the detection voltage causes no false alarm; and since the detection voltage is adequately higher than the de-trigger voltage, the transmission of the power failure alert can be halted as soon as the power supply recovers. In the normal power supply circumstance, if the above-mentioned error percentages and errors are taken into consideration and the temperature rises up to 50° C., the minimum detection voltage (i.e., the detection voltage in the worst case) can be calculated according to the following equation:

$$V_{DET} = \frac{\left(12 \times 0.95 - 13 \times 0.7 \times 1.01 - 13 \times \frac{0.007}{13} \times 50\right) \times 430}{430 + 49.9} = 1.666V$$

In regard to the above equation, the minimum detection voltage (i.e., 1.666V) is still higher than the trigger voltage (i.e., 1.25V) and higher than the de-trigger voltage (i.e., 1.55V); accordingly, the detection voltage causes no false alarm, and the transmission of the power failure alert can be halted as soon as the power supply recovers. In a power failure circumstance without considering the above-mentioned error percentages, errors, and temperature variation, the input voltage decreases after power failure; when the input voltage decreases to 10.5V, the detection voltage is 1.254V approaching the trigger voltage (i.e., 1.25V); accordingly, as the input voltage continually decreases, the detection result will soon change from the first detection result (i.e., $V_{DET} > V_{TRIG}$) to the second detection result (i.e., $V_{DET} < V_{TRIG}$), and then the requirements for the transmission of the power failure alert is fulfilled.

It is noted that the exemplary implementations of FIGS. 2-3 are for understanding rather than limitations to the present invention. At least some circuit(s) in FIGS. 2-3 can be replaced with its/their equivalent circuit(s). For example, the input voltage and a reference resistor can be used to form a reference current, and the detection voltage generating circuit 120 can generate a target current with a current mirror according to the reference current while the ratio of the target current to the reference current can be determined by the control of the size(s) of transistors of the current mirror; then, the detection voltage generating circuit 120 can generate the detection voltage according to the target current and a resistor.

Figure 4:
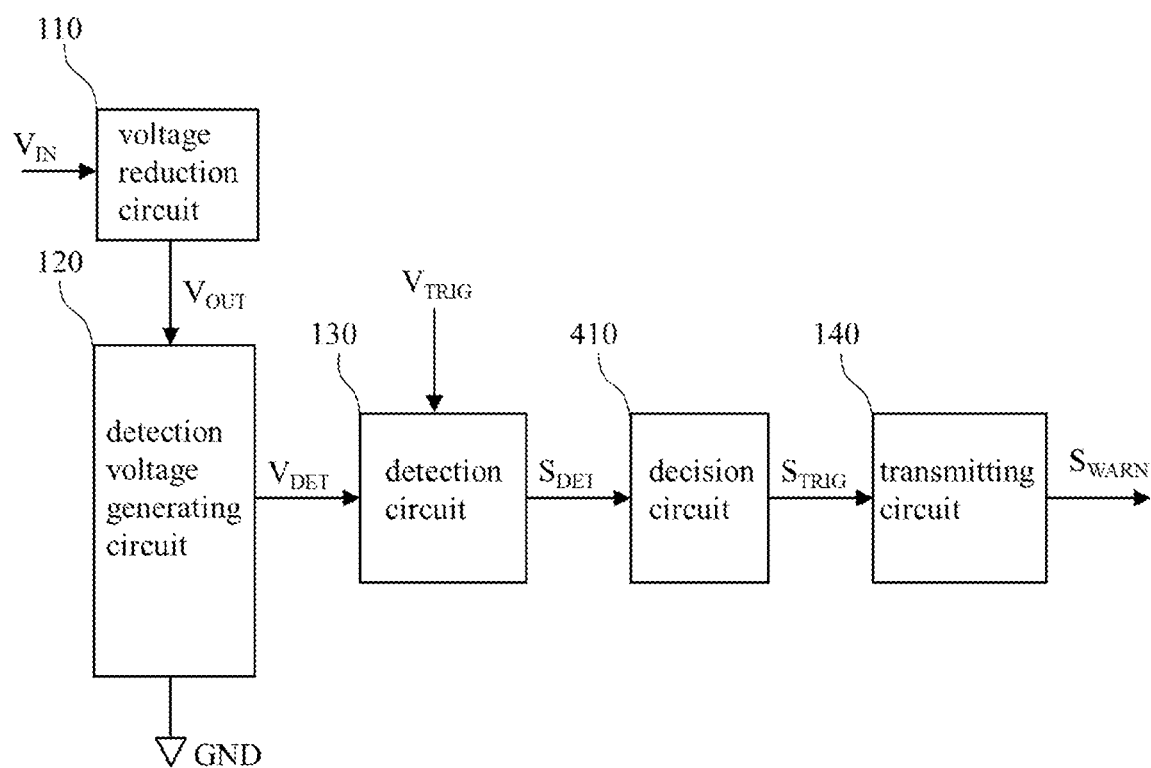
FIG. 4 shows another embodiment of the power failure detection device of the present disclosure.

FIG. 4 shows another embodiment of the power failure detection device of the present disclosure. Compared with FIG. 1, the power failure detection device 400 of FIG. 4 further includes a decision circuit 410 for generating a trigger signal ($S_{TRIG}$) according to the detection result, wherein when the detection result indicates that the detection voltage is lower than the trigger voltage, the transmitting circuit 140 determines whether to send the power failure alert to the far-end device according to the trigger signal instead of the detection result.

Figure 5:
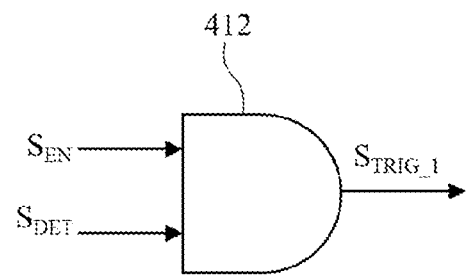
FIG. 5 shows an exemplary implementation of the power failure detection device of FIG. 4.

FIG. 5 shows an exemplary implementation of the power failure detection device 400 of FIG. 4. As shown in FIG. 5, the decision circuit 410 includes a logical circuit 412 (e.g., a logical AND gate). This logical circuit 412 is configured to generate a first trigger signal ($S_{TRIG\_1}$) according to the detection result ($S_{DET}$) and an enablement signal ($S_{EN}$). In a circumstance that the enablement signal (e.g., a level-high signal) enables a dying gasp function of the power failure detection device 400, on condition that the detection result indicates that the detection voltage is lower than the trigger voltage and the first trigger signal functions as the trigger signal, the transmitting circuit 140 sends the power failure alert to the far-end device according to the first trigger signal. In a circumstance that the enablement signal (e.g., a level-low signal) disables the dying gasp function of the power failure detection device 400, the transmitting circuit 140 does not send the power failure alert to the far-end device regardless of the detection result. An example of the enablement signal is a software setting signal for enabling/disabling the dying gasp function of the power failure detection device 400, and the default level of the enablement signal is a high level.

Figure 6:
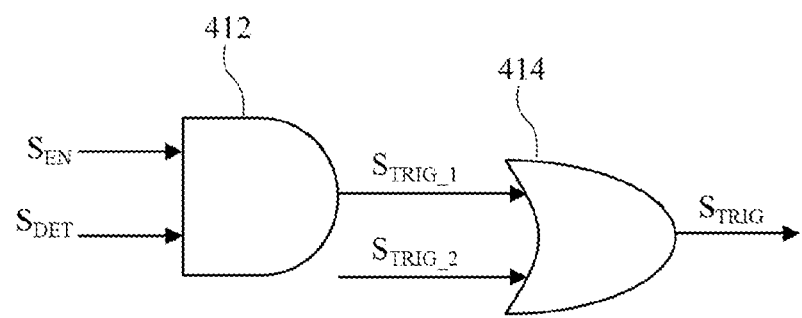
FIG. 6 shows another exemplary implementation of the power failure detection device of FIG. 4.

FIG. 6 shows another exemplary implementation of the power failure detection device 400 of FIG. 4. Compared with FIG. 5, the decision circuit 410 further includes another logical circuit 414 (e.g., a logical OR gate) configured to generate the trigger signal ($S_{TRIG}$) according to the first trigger signal ($S_{TRIG\_1}$) and a second trigger signal ($S_{TRIG\_2}$), wherein the second trigger signal is a software setting signal (e.g., a software setting signal indicative of a user voluntarily disconnecting a network connection). In a circumstance that the enablement signal ($S_{EN}$) enables the dying gasp function, provided that the first trigger signal functions as the trigger signal and the second trigger signal is at a low level, the transmitting circuit 140 sends the power failure alert to the far-end device according to the first trigger signal when the detection result indicates that the detection voltage is lower than the trigger voltage; and provided that the second trigger signal functions as the trigger signal and is at a high level, the transmitting circuit 140 sends the power failure alert to the far-end device according to the second trigger signal regardless of the detection result.

Figure 7:
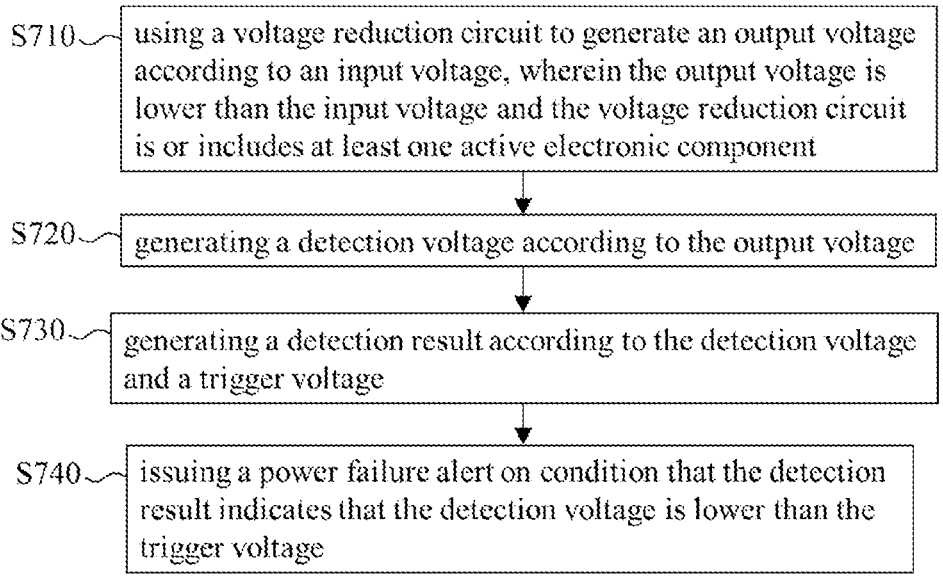
FIG. 7 shows an embodiment of the power failure detection method of the present disclosure.

FIG. 7 shows an embodiment of the power failure detection method of the present disclosure. The embodiment of FIG. 7 includes the following steps:

Step S710: an output voltage is generated, by a voltage reduction circuit, according to an input voltage, wherein the output voltage is lower than the input voltage and the voltage reduction circuit is or includes at least one active electronic component;

Step S720: a detection voltage is generated according to the output voltage;

Step S730: a detection result is generated according to the detection voltage and a trigger voltage; and Step S740: a power failure alert is issued on condition that the detection result indicates that the detection voltage is lower than the trigger voltage.

Since those of ordinary skill in the art can appreciate the detail and modification of the embodiment of FIG. 7 by referring to the disclosure of the embodiments of FIGS. 1-6, repeated and redundant description is omitted here.

It is noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, in comparison with the prior art, the present invention can increase the hold time of a dying gasp function without using any additional capacitor or a large capacitor, and can ensure that a user terminal has enough time to issue a power failure alert.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A power failure detection device, comprising:
   a voltage reduction circuit configured to generate an output voltage according to an input voltage, wherein the output voltage is lower than the input voltage and the voltage reduction circuit is or includes at least one active electronic component;
   a detection voltage generating circuit coupled between the voltage reduction circuit and a low voltage terminal, and configured to generate a detection voltage according to the output voltage, wherein the detection voltage is lower than the output voltage and higher than a voltage of the low voltage terminal;
   a detection circuit configured to generate a detection result according to the detection voltage and a trigger voltage; and
   a transmitting circuit configured to send a power failure alert to a far-end device on condition that the detection result indicates that the detection voltage is lower than the trigger voltage.

2. The power failure detection device of claim 1, wherein the at least one active electronic component is at least one diode.

3. The power failure detection device of claim 2, wherein the at least one diode is at least one Zener diode.

4. The power failure detection device of claim 2, wherein the at least one diode includes a plurality of diodes connected in series.

5. The power failure detection device of claim 1, wherein the detection voltage generating circuit includes: a first resistor; a second resistor; and a node coupled between the first resistor and the second resistor, the node having a voltage equal to the detection voltage.

6. The power failure detection device of claim 5, wherein a resistance value of the first resistor is smaller than a resistance value of the second resistor.

7. The power failure detection device of claim 1, wherein the detection circuit includes a comparator, and the comparator is configured to compare the detection voltage with the trigger voltage in order to generate the detection result.

8. The power failure detection device of claim 1, further comprising:
   a decision circuit configured to generate a trigger signal according to the detection result,
   wherein in a circumstance that the detection result indicates that the detection voltage is lower than the trigger voltage, the transmitting circuit determines whether to send the power failure alert to the far-end device according to the trigger signal.

9. The power failure detection device of claim 8, wherein the decision circuit includes:
   a first logical circuit configured to generate a first trigger signal according to the detection result and an enablement signal,
   wherein in a circumstance that the enablement signal is used for enabling a dying gasp function of the power failure detection device, on condition that the first trigger signal functions as the trigger signal, the transmitting circuit sends the power failure alert to the far-end device according to the first trigger signal when the detection result indicates that the detection voltage is lower than the trigger voltage.

10. The power failure detection device of claim 9, wherein the first logical circuit is a logical AND gate.

11. The power failure detection device of claim 9, wherein the decision circuit further includes:
    a second logical circuit configured to generate the trigger signal according to the first trigger signal and a second trigger signal,
    wherein the second trigger signal is a software setting signal, and on condition that the second trigger signal functions as the trigger signal instead, the transmitting circuit sends the power failure alert to the far-end device according to the second trigger signal regardless of the first trigger signal.

12. The power failure device of claim 11, wherein the second logical circuit is a logical OR gate.

13. The power failure detection device of claim 1, wherein the transmitting circuit is used for wired-network communication, and the power failure alert is a network packet.

14. A power failure detection method, comprising:
    using a voltage reduction circuit to generate an output voltage according to an input voltage, wherein the output voltage is lower than the input voltage and the voltage reduction circuit is or includes at least one active electronic component;
    generating a detection voltage according to the output voltage;
    generating a detection result according to the detection voltage and a trigger voltage; and
    issuing a power failure alert on condition that the detection result indicates that the detection voltage is lower than the trigger voltage.

15. The power failure detection method of claim 14, wherein the at least one active electronic component is at least one diode.

16. The power failure detection method of claim 15, wherein the at least one diode is at least one Zener diode.

17. The power failure detection method of claim 15, wherein the at least one diode includes a plurality of diodes connected in series.

18. The power failure detection method of claim 14, wherein the step of generating the detection result includes: comparing the detection voltage with the trigger voltage in order to generate the detection result.

19. The power failure detection method of claim 14, further comprising: generating a trigger signal according to the detection result; and determining whether to issue the power failure alert according to the trigger signal when the detection result indicates that the detection voltage is lower than the trigger voltage.

20. The power failure detection method of claim 14, wherein the output voltage is lower than a half of the input voltage.

\* \* \* \* \*